United States Patent
Mutoh et al.

(10) Patent No.: US 6,384,774 B1
(45) Date of Patent: May 7, 2002

(54) GPS RECEIVER AND TERMINAL DEVICE HAVING SEARCH FREQUENCY BAND SWITCHING FUNCTION

(75) Inventors: Katsuhiko Mutoh, Obu; Osamu Yamamori, Yokohama; Katsumi Isogimi, Tokyo, all of (JP)

(73) Assignees: Denso Corporation, Aichi-ken; NTT Docomo, Inc., Tokyo, both of (JP)

(*) Notice: Subject to any disclaimer, the term of this patent is extended or adjusted under 35 U.S.C. 154(b) by 0 days.

(21) Appl. No.: 09/723,620

(22) Filed: Nov. 27, 2000

(30) Foreign Application Priority Data

Dec. 3, 1999 (JP) .......................................... 11-344689

(51) Int. Cl.$^7$ ................................................ G01S 7/19
(52) U.S. Cl. .................................. 342/357.06; 701/213
(58) Field of Search ..................... 342/357.06; 701/213, 701/214

(56) References Cited

U.S. PATENT DOCUMENTS 6,236,354 B1 * 5/2001 Krasner ................. 342/357.06

* cited by examiner

Primary Examiner—Theodore M. Blum
(74) Attorney, Agent, or Firm—Fish & Richardson P.C.

(57) ABSTRACT

A terminal device has a GPS receiver which receives GPS signals from a GPS satellite. The terminal device has an operation unit for instructing operation modes of the GPS receiver, and the GPS receiver has a clock unit, a radio frequency unit and a data extraction unit. The data extraction unit extracts GPS data by scanning signal-to-noise ratios of each frequency over a search frequency band. When a band correction mode is instructed by the operation unit, the data extraction unit switches its search frequency band from a first frequency band determined based on a maximum temperature-dependent change in the frequency of a clock signal to a second frequency band determined based on a maximum aging-dependent change in the frequency of the clock signal.

10 Claims, 5 Drawing Sheets

GPS RECEIVER AND TERMINAL DEVICE HAVING SEARCH FREQUENCY BAND SWITCHING FUNCTION

CROSS REFERENCE TO RELATED APPLICATION

This application is based on and incorporates herein by reference Japanese Patent Application No. 11-344689 filed Dec. 3, 1999.

BACKGROUND OF THE INVENTION

The present invention relates to a GPS (global positioning system) receiver that extracts GPS data from a GPS satellite signal of intermediate frequency by scanning signal-to-noise ratios of the GPS signal of the intermediate frequency over search frequency band and detecting a frequency at which the signal-to-noise ratio is maximum above a threshold. The present invention further relates to a terminal device using the GPS receiver.

GPS receivers and portable terminal devices using the GPS receivers are used for telecommunication. Each GPS receiver 1 is constructed typically, as shown in FIG. 7 in a block diagram form, with a clock unit 2 including a clock generator, a radio frequency (RF) unit 3, a data extraction unit 4, a data memory unit 5, a data calculation unit 6 and an antenna 7. The clock unit 2 generates a reference clock signal at a fixed frequency so that the RF unit 3, data extraction unit 4 and data calculation unit 6 operate in synchronism with the reference clock signal.

Specifically, the RF unit 3 mixes a GPS signal of radio frequency received from a GPS satellite (not shown) by the antenna 7 with its local oscillation signal to generate a GPS signal of intermediate frequency. The data extraction unit 4 sets, as shown in FIG. 8, its center frequency f1 which deviates from a reference frequency f0 by a frequency corresponding to the estimated Doppler shift of the GPS satellite. It also sets a search frequency band fW1 based on the center frequency f1 and a maximum change (error) in frequency of the clock signal which will be caused due to changes in temperature of the clock generator.

The data extraction unit 4 scans signal-to-noise ratios (SNR) of the GPS signal received from the RF unit 3 over the search frequency band fW1, and detects a frequency which provides a maximum signal-to-noise ratio above a predetermined threshold signal-to-noise ratio Th. Thus, the data extraction unit 4 extracts GPS data from the GPS signal of the intermediate frequency. The extracted data are temporarily stored in a data memory unit 5 and used in the data calculation unit 6. The above operation of the data extraction unit 4 is controlled by control commands from the data calculation unit 6.

It is to be noted that the frequency of the clock signal of the clock unit 2 also changes due to aging of the clock generator. As the change or error in the frequency of the clock signal (aging error) increases, the frequency band which provides the maximum signal-to-noise ratio above the threshold Th of the GPS signal generated by the RF unit 3 deviates from the search frequency band fW1. In case that the frequency f2 which provides the maximum signal-to-noise ratio greatly deviates from the search frequency band fW1 as shown in FIG. 9, the frequency of the maximum signal-to-noise ratio cannot be detected resulting in failure of extracting GPS data appropriately.

If the search frequency band is set in correspondence with a maximum aging error, the search frequency band will have to be set wide. As a result, the data extraction unit 4 requires a longer period to scan the signal-to-noise ratios over the widened search frequency band. The GPS receiver 1 requires more electric power contrary to a requirement that a terminal device using the GPS receiver consumes less power.

SUMMARY OF THE INVENTION

It is therefore an object of the present invention to provide a GPS receiver and a portable terminal device using the GPS receiver, which can extract GPS data accurately from a GPS signal of intermediate frequency even when the frequency of a reference clock signal changes.

According to the present invention, a GPS receiver comprises a clock unit, a radio frequency unit, and a data extraction unit. The data extraction unit scans signal-to-noise ratios of a GPS signal generated by the radio frequency unit over a search frequency band and detects a frequency at which a signal-to-noise ratio of the GPS signal is higher than a threshold ratio in the searched frequency band to extract GPS data from the GPS signal. The data extraction unit sets the search frequency band to a first frequency band in a normal mode and to a second frequency band in a band correction mode. The first frequency band has a first center frequency determined based on an estimated Doppler shift of a GPS satellite and a band width determined based on a generally maximum temperature-dependent change in a frequency of the reference clock signal. The second frequency band has a band width determined based on a generally maximum aging-dependent change in the frequency of the reference clock signal.

Further, the data extraction unit further sets the search frequency band to a third frequency band after the band correction mode. The third frequency band has a center frequency around a second center frequency which provides a generally maximum detected signal-to-noise ratio above the threshold as a result of scanning the signal-to-noise ratios over the second search frequency band in the band correction mode. The third search frequency band has the same band width as that of the first search frequency band, or a band width narrower than that of the first search frequency band.

The mode switching from the normal mode to the band correction mode may be made manually by a user, or automatically based on the signal-to-noise ratios scanned in the normal mode or a period of use of the clock generator.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
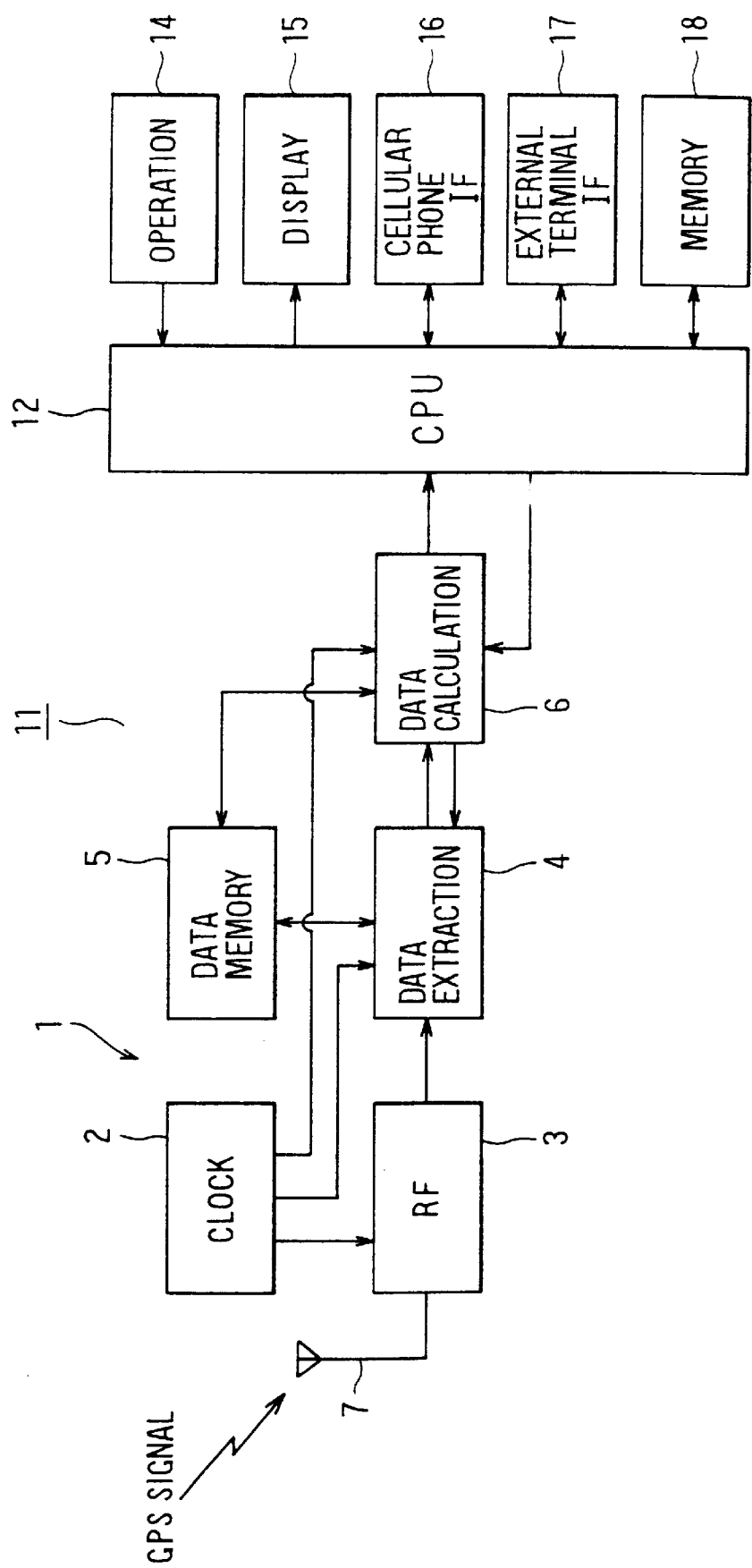
FIG. 1 is a block diagram showing a portable terminal device using a GPS receiver according to an embodiment of the present invention.
Figure 7:
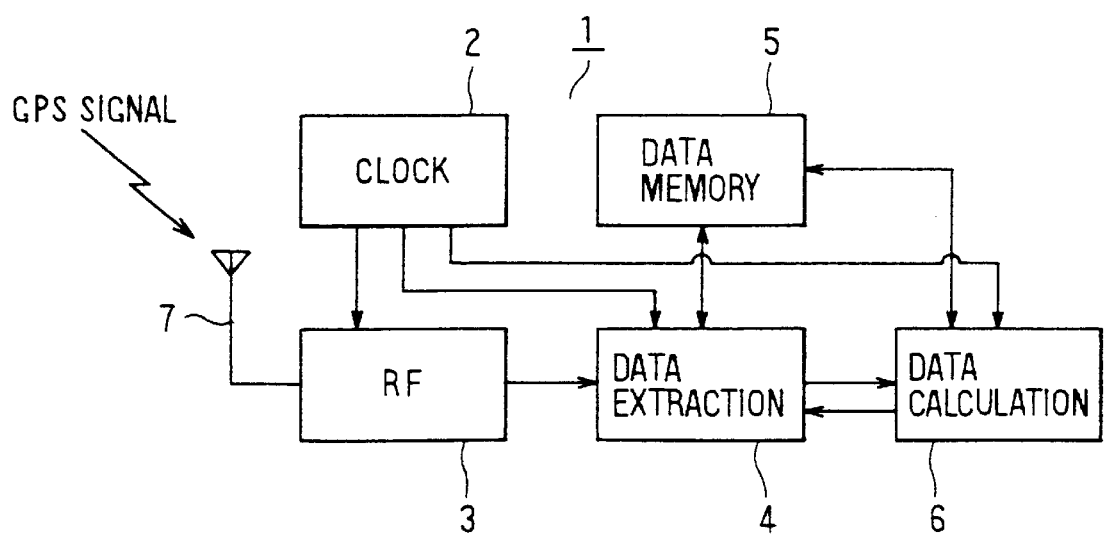
FIG. 7 is a block diagram showing a GPS receiver according to a related art.
Figure 8:
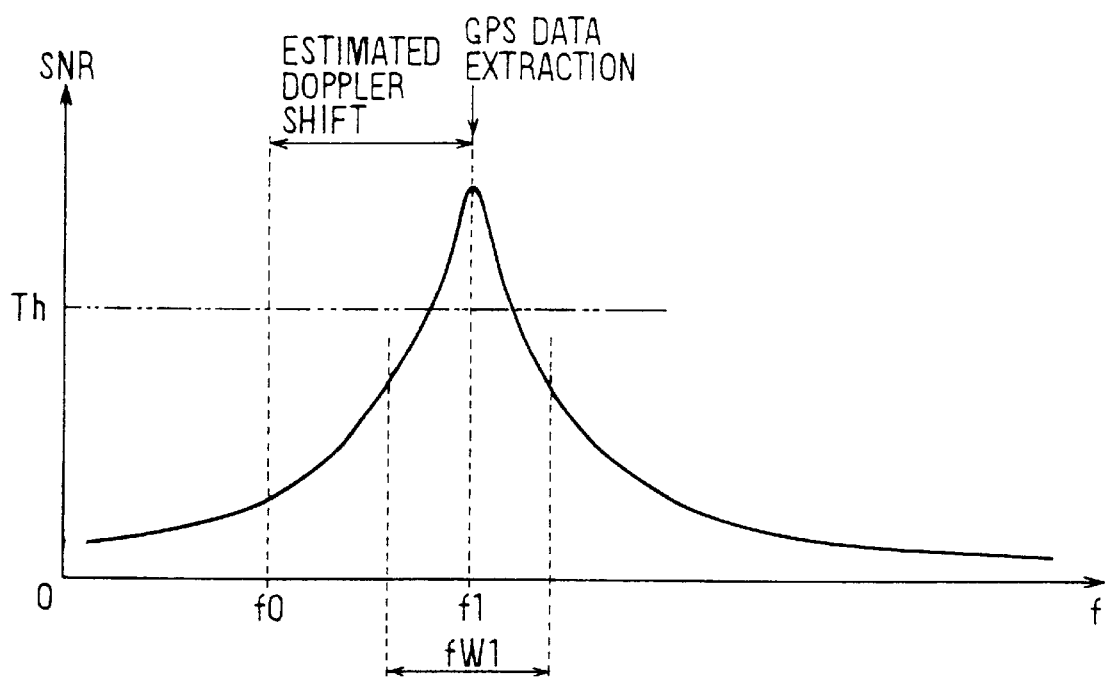
FIG. 8 is a characteristic diagram showing a relationship between a frequency of a GPS signal and a signal-to-noise ratio of the GPS signal in the related art.
Figure 9:
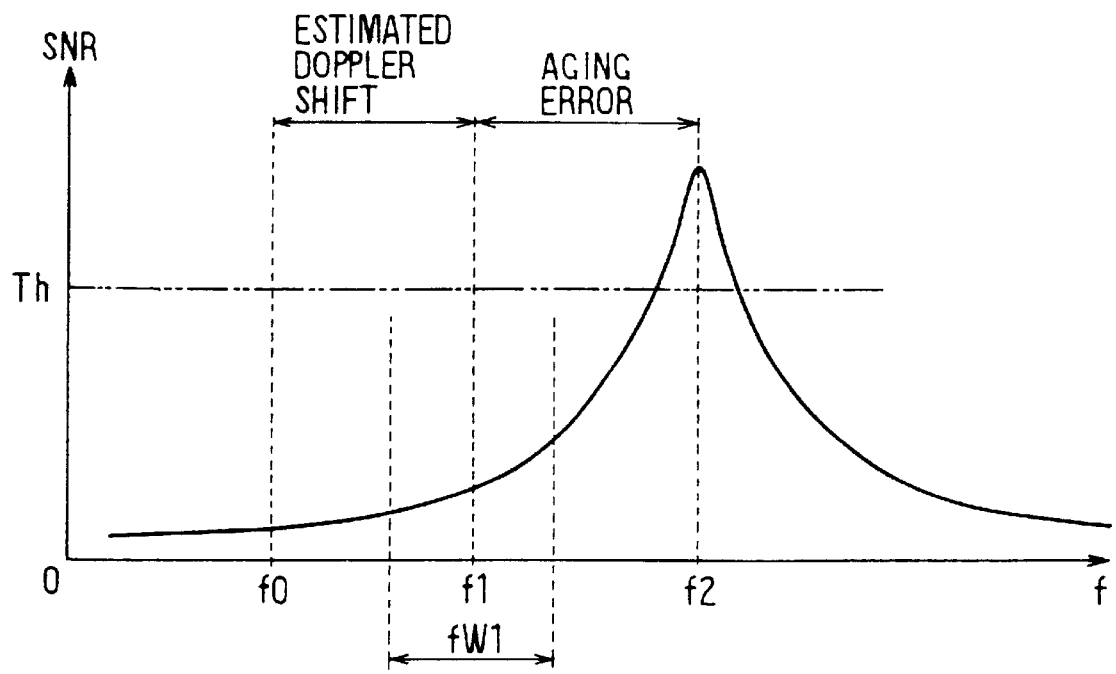
FIG. 9 is a characteristic diagram showing a relationship between a frequency of a GPS signal and a signal-to-noise ratio of the GPS signal when an aging error occurs in the related art.

The present invention will be described with reference to an embodiment, in which a GPS receiver 1 is incorporated in a portable terminal device 11 as shown in FIG. 1. The GPS receiver 1 is constructed in the similar manner as in the related art shown in FIG. 7. The GPS receiver 1 basically operates in the similar manner as described with reference to the related art, and applies calculated data to the CPU 12.

The portable terminal device 11 is constructed further with a central processing unit (CPU 12), a manual operation unit 14, display unit 15, interface (IF) unit 16 for connection with a cellular phone (not shown), interface (IF) unit 17 for connection with other external devices, and a memory unit 18.

The operation unit 14 applies key operation signals to the CPU 12 when its keys are operated by a user. The operation unit 14 is used to control operation modes, that is, normal mode and band correction mode of the GPS receiver 1. The CPU 12 executes programmed processing by decoding key operation in response to key operation detection signals from the operation unit 14. The display unit 15 displays information upon receiving display commands from the CPU 12. The IF unit 16 has an interface function for the cellular phone, and controls communication with the cellular phone when the cellular phone is connected. The IF unit-6 17 has an interface function for other external terminal devices such as a personal computer, controls communication with the external terminal device. The memory unit 18 stores various information such as map data, personal data, schedule data or the like.

In operation, the CPU 12 determines whether the normal mode or the band correction mode is instructed by the operation unit 14. The CPU 12 may determine the mode to be normal when no specific operation is made on the operation unit 14.

Figure 2:
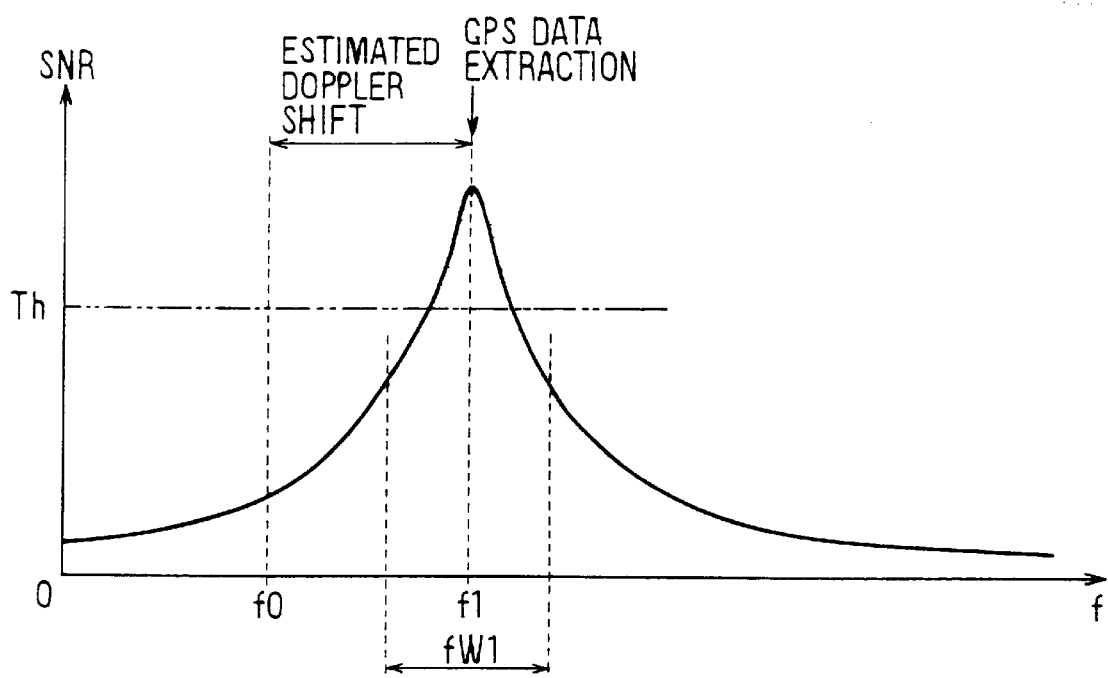
FIG. 2 is a characteristic diagram showing a relationship between a frequency of a GPS signal and a signal-to-noise ratio of the GPS signal under a normal mode.

In the normal mode, the data calculation unit 6 applies a normal operation mode command to the data extraction unit 4. The data extraction unit 4 sets, as shown in FIG. 2, a first center frequency f1 which deviates from a reference frequency f0 by a predetermined frequency corresponding to an estimated Doppler shift of the GPS satellite. The data extraction unit 4 further sets a first search frequency band fW1 to have the first center frequency f1 at the center of the search frequency band fW1.

The search frequency band fW1 may be calculated as follows, assuming that the maximum error α1 caused by temperature dependent changes of the clock generator is ±0.05 ppm.

$$fW1 = 1575.42 \text{ MHz} \times 0.5 \text{ ppm} \times 2 = 1575.42 \text{ Hz}$$

The data extraction unit 4 thus scans the signal-to-noise ratios (SNR) of the GPS signal of the intermediate frequency received from the RF unit 3 over the search frequency band fW1, and searches for and detects a frequency which is higher than the threshold Th and a maximum. This frequency is shown as the center frequency f1 of the search frequency band fW1 in FIG. 2.

The data extraction unit 4 then extracts data from the GPS signal of this detected frequency.

Figure 3:
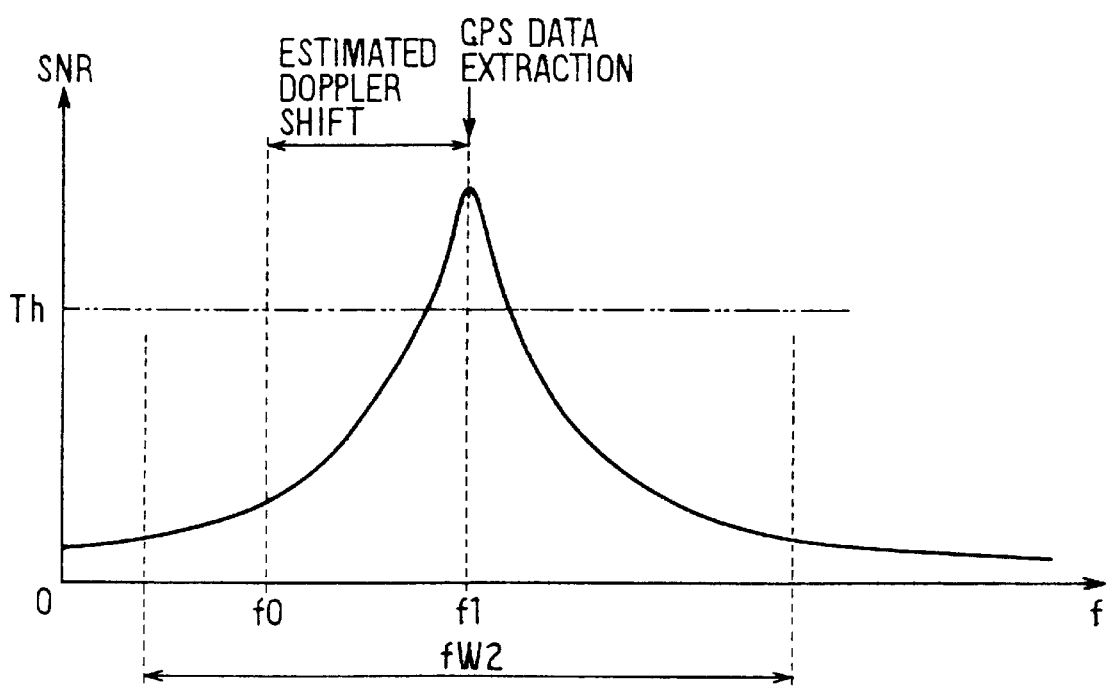
FIG. 3 is a characteristic diagram showing a relationship between a frequency of a GPS signal and a signal-to-noise ratio of the GPS signal under a band correction mode.

In the correction mode in which the operation unit 14 is manipulated in a predetermined manner, the CPU 12 applies a correction command to the data calculation unit 6, which in turn controls the data extraction unit 4 to correct the search frequency band. The data extraction unit 4 sets, as shown in FIG. 3, the center frequency f1 which deviates from the reference frequency f0 by the predetermined frequency corresponding to the estimated Doppler shift of the GPS satellite. The data extraction unit 4 sets a second search frequency band fW2 to have the center frequency f1 at the center of the search frequency band fW1. In the band correction mode, the second search frequency band fW2 is determined not by the temperature-dependent error of the clock generator but by the aging error, that is, error or change caused by the period of use of the clock generator.

The search frequency band fW2 may be calculated as follows, assuming that the maximum error α2 caused by time-dependent changes of the clock generator is ±2.0 ppm. This frequency band fW2 is about 4 times wider than the first frequency band fW1.

$$fW2 = 1575.42 \text{ MHz} \times 2.0 \text{ ppm} \times 2 = 6301.68 \text{ Hz}$$

The data extraction unit 4 thus scans the signal-to-noise ratios (SNR) of the GPS signal of the intermediate frequency received from the RF unit 3 over the search frequency band fW2, and detects a frequency which provides a maximum signal-to-noise ratio above the threshold Th. This frequency is shown as the center frequency f1 of the search frequency band fW2 in FIG. 3.

The data extraction unit 4 then extracts data from the GPS signal of this detected frequency.

Figure 4:
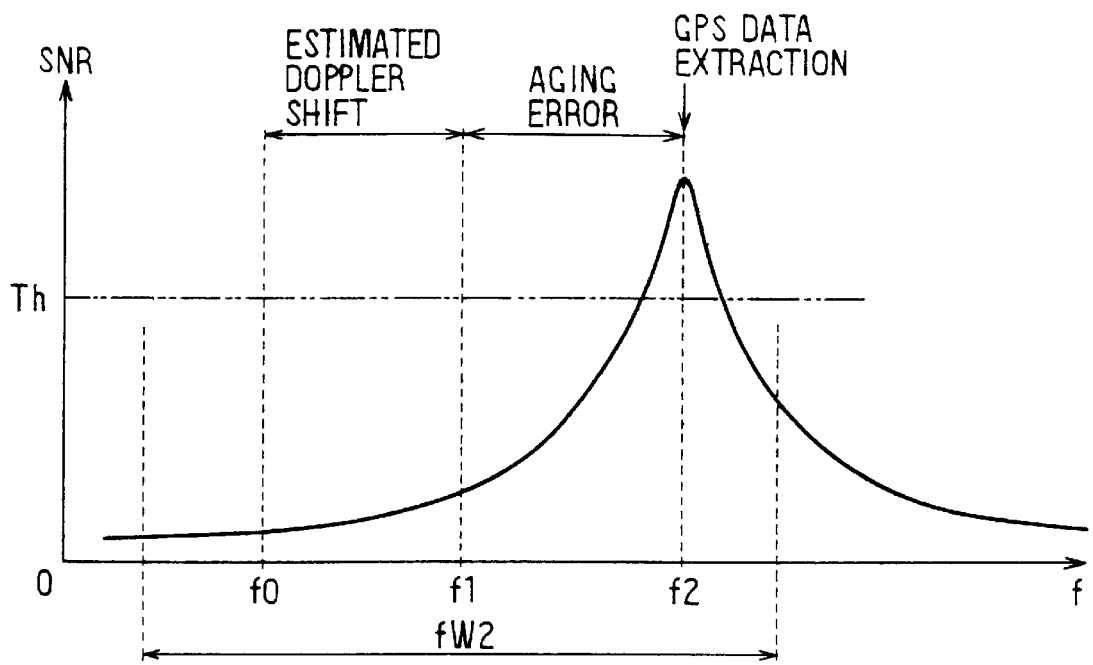
FIG. 4 is a characteristic diagram showing an exemplary relationship between a frequency of a GPS signal and a signal-to-noise ratio of the GPS signal when the band correction mode is effected.

When the frequency of the reference clock generated by the clock unit 2 changes due to aging of the clock generator, the frequency that provides the maximum signal-to-noise ratio will deviate to a second frequency f2, for example, as shown in FIG. 4. However, as the search frequency band fW2 is wide enough to accommodate this deviation, the frequency f2 can be detected in scanning the signal-to-noise ratios over the second search frequency band fW2.

Figure 5:
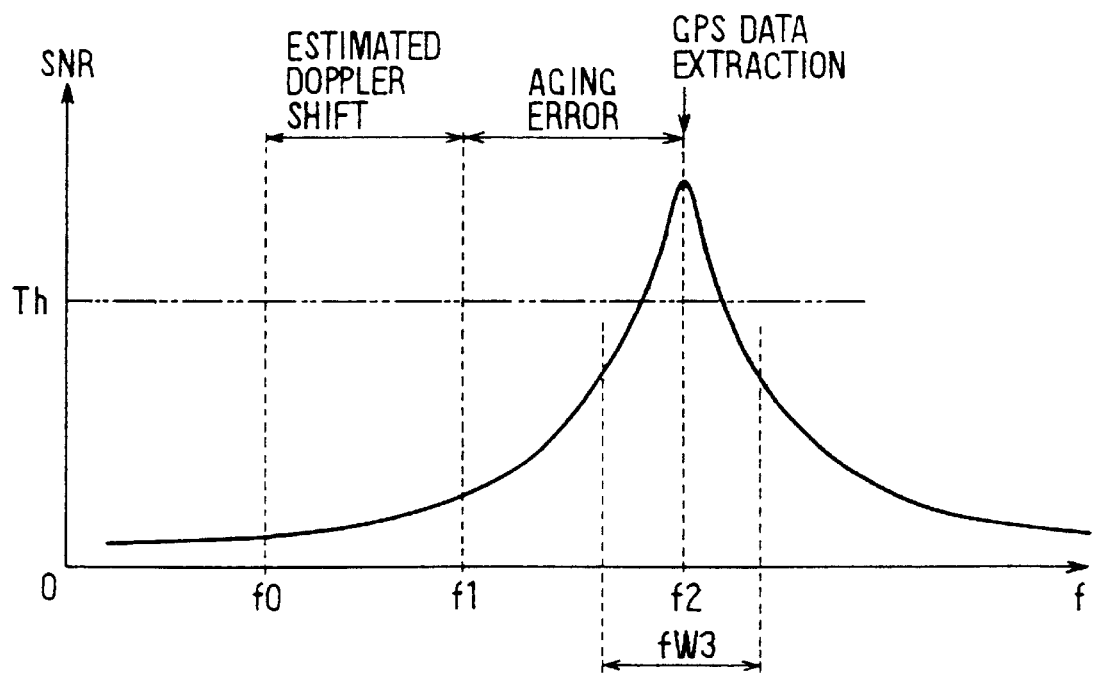
FIG. 5 is a characteristic diagram showing a relationship between a frequency of a GPS signal and a signal-to-noise ratio of the GPS signal when the mode is returned to the normal mode after the band correction mode.

When the mode is switched back to the normal mode after the correction mode has been set once, the data extraction unit 4 sets the center frequency of the search frequency band to the second frequency f2 which provided the maximum signal-to-noise ratio in the correction mode. Further, the data extraction unit 4 sets a third search frequency band fW3 around the second center frequency f2 as shown in FIG. 5. The width of the third search frequency band fW3 is determined based on the maximum time-dependent error in the frequency of the clock signal caused by changes in temperature of the clock generator.

The data extraction unit 4 thus scans the signal-to-noise ratios (SNR) of the GPS signal of the intermediate frequency received from the RF unit 3 over the search frequency band fW3, and detects a frequency which provides a maximum signal-to-noise ratio above the threshold Th. This frequency is shown as the center frequency f2 of the search frequency band fW3 in FIG. 5.

The data extraction unit 4 then extracts data from the GPS signal of this detected frequency.

According to the above embodiment, not only the aging-dependent error can be compensated for by the band correction mode, but also the signal-to-noise ratio scanning time and electric power can also be saved because the band correction mode is effected only when instructed. Further, the signal-to-noise ratio scanning can be effected accurately with less time and electric power once the band correction mode has been effected because the search frequency band is set based on the temperature-dependent error again after the band correction mode.

In the above embodiment, various modifications may be made.

Figure 6:
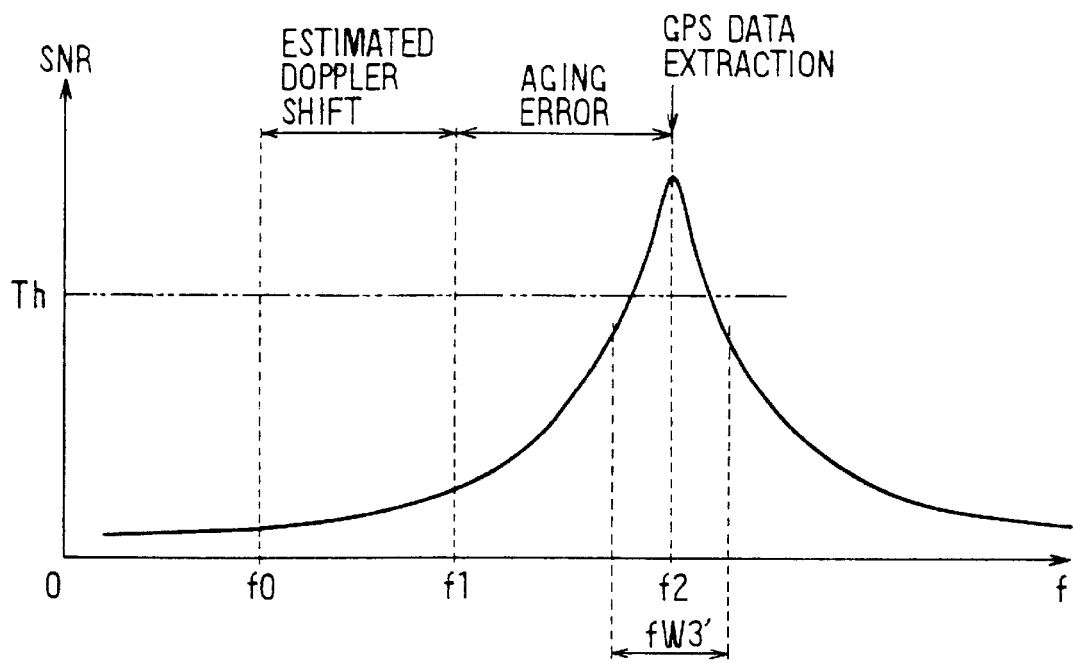
FIG. 6 is a characteristic diagram showing another relationship between a frequency of a GPS signal and a signal-to-noise ratio of the GPS signal when the mode is returned to the normal mode after the band correction mode.

For instance, the third search frequency band fW3 set in correspondence with the maximum error in frequency caused by temperature changes may be set to a narrower band fW3 as shown in FIG. 6. The CPU 12 may be programmed to set the correction mode automatically without requiring manipulation of the operation unit 14 by, for instance, monitoring the period of use of the clock generator or monitoring magnitudes of the signal-to-noise ratios. The clock signal may be supplied to the data calculation unit 6 through the data extraction unit 4. The GPS data may be extracted from a frequency other than the frequency which provides the maximum signal-to-noise ratio, as long as a signal-to-noise ratio scanned over the search frequency band exceeds the threshold Th. This is particularly advantageous when the frequency which provides the maximum signal-to-noise ratio cannot be detected within the search frequency band, that is, when such a frequency is outside the search frequency band.

Further, the first search frequency band fW1 may be set to have its center frequency around the first center frequency f1 and the third frequency search band fW3 may be set to have its center frequency around the second frequency f2 which provides the maximum signal-to-noise ratio above the threshold Th. The maximum errors α1 and α2 may be set based on the type of clock generators.

What is claimed is:

1. A GPS receiver for receiving GPS signals transmitted from a GPS satellite comprising:

clock generator means for generating a reference clock signal;

radio frequency means operable in synchronism with the clock signal for receiving a GPS signal of a radio frequency transmitted from the GPS satellite and generating a GPS signal of an intermediate frequency; and data extraction means for scanning signal-to-noise ratios of the generated GPS signal over a search frequency band and detecting a frequency at which a signal-to-noise ratio of the generated GPS signal is higher than a threshold ratio in the searched frequency band to extract GPS data from the generated GPS signal, wherein the data extraction means sets the search frequency band to a first frequency band in a normal mode and to a second frequency band in a band correction mode, the first frequency band having a first center frequency determined based on an estimated Doppler shift of the GPS satellite and a band width determined based on a generally maximum temperature-dependent change in a frequency of the reference clock signal, and the second frequency band having a band width determined based on a generally maximum aging-dependent change in the frequency of the reference clock signal.

2. The GPS receiver as in claim 1, wherein:

the data extraction means further sets the search frequency band to a third frequency band after the band correction mode, the third frequency band having a center frequency around a second center frequency which provides a maximum detected signal-to-noise ratio above the threshold as a result of scanning the signal-to-noise ratios over the second search frequency band in the band correction mode.

3. The GPS receiver as in claim 2, wherein:

the third search frequency band has the same band width as that of the first search frequency band.

4. The GPS receiver as in claim 2, wherein:

the third search frequency band has a band width narrower than that of the first search frequency band.

5. The GPS receiver as in claim 1, wherein:

the band width of the first frequency band is determined based on a maximum temperature-dependent change in the frequency of the reference clock signal, and the band width of the second frequency band is determined based on a maximum aging-dependent change in the frequency of the reference clock signal.

6. The GPS receiver as in claim 1, further comprising:

manual operation means for manually instructing a mode switching from the normal mode to the band correction mode.

7. The GPS receiver as in claim 1, further comprising:

automatic operation means for automatically instructing a mode switching from the normal mode to the band correction mode based on the signal-to-noise ratios scanned in the normal mode.

8. The GPS receiver as in claim 1, further comprising:

automatic operation means for automatically instructing a mode switching from the normal mode to the band correction mode based on a period of use of the clock generating means.

9. The GPS receiver as in claim 1, wherein:

the radio frequency means mixes the received GPS signal with a local oscillation signal to generate the generated GPS signal.

10. A terminal device having the GPS receiver as in claim 1, comprising:

data processing means connected to the data extraction means for processing the extracted GPS data.

* * * * *